(12) United States Patent
Shinohara et al.

(10) Patent No.: US 9,543,033 B1
(45) Date of Patent: Jan. 10, 2017

(54) SEMICONDUCTOR MEMORY DEVICE, CONTROL METHOD, AND MEMORY SYSTEM

(71) Applicant: Kabushiki Kaisha Toshiba, Minato-ku (JP)

(72) Inventors: Koichi Shinohara, Fujisawa (JP); Yoshikazu Takeyama, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/057,728

(22) Filed: Mar. 1, 2016

Related U.S. Application Data

(60) Provisional application No. 62/257,254, filed on Nov. 19, 2015.

(51) Int. Cl.
  *G11C 16/26* (2006.01)
  *G11C 16/34* (2006.01)
  *G11C 16/04* (2006.01)
  *G11C 16/10* (2006.01)
  *G11C 11/56* (2006.01)

(52) U.S. Cl.
  CPC ....... *G11C 16/3459* (2013.01); *G11C 11/5628* (2013.01); *G11C 11/5642* (2013.01); *G11C 16/0483* (2013.01); *G11C 16/10* (2013.01); *G11C 16/26* (2013.01)

(58) Field of Classification Search
  CPC .................................................... G11C 16/26
  USPC ............................................ 365/189.15, 184
  See application file for complete search history.

(56) References Cited

U.S. PATENT DOCUMENTS

| 7,778,087 | B2 | 8/2010 | Tu et al. | |
|---|---|---|---|---|
| 7,876,614 | B2 | 1/2011 | Kang et al. | |
| 8,094,495 | B2 | 1/2012 | Toyama | |
| 2007/0002614 | A1* | 1/2007 | Jeong | G11C 16/3481 365/185.03 |
| 2008/0080238 | A1* | 4/2008 | Yuda | G11C 11/5671 365/185.03 |
| 2010/0027326 | A1* | 2/2010 | Kim | G11C 13/0069 365/163 |

(Continued)

FOREIGN PATENT DOCUMENTS

| JP | 2009-104763 | 5/2009 |
|---|---|---|
| JP | 2009-158082 | 7/2009 |
| JP | 2010-129103 | 6/2010 |

*Primary Examiner* — Hoai V Ho
*Assistant Examiner* — Jay Radke
(74) *Attorney, Agent, or Firm* — Oblon, McClelland, Maier & Neustadt, L.L.P.

(57) ABSTRACT

According to one embodiment, a semiconductor memory device includes a memory cell array, a first circuit, and a second circuit. The first circuit executes program and read. The program is processing for changing a threshold voltage of a memory cell to a voltage according to data. The data includes first data of a bit and second data of a bit. The program of the second data is executed after the program of the first data. The read includes measuring the threshold voltage. The second circuit manipulates a flag in accordance with execution of the program of the second data. In a case where the second data is a target of the read, the second circuit refers to the flag. In a case where the flag indicates non-execution of the program of the second data, the second circuit aborts the measuring before the measuring of the threshold voltage is completed.

20 Claims, 6 Drawing Sheets

(56) References Cited

U.S. PATENT DOCUMENTS

| | | | | |
|---|---|---|---|---|
| 2012/0250411 A1* | 10/2012 | Abiko | .................... | G11C 16/26 365/185.09 |
| 2015/0089325 A1* | 3/2015 | Chandrasekhar | ... | G06F 11/1072 714/766 |
| 2016/0118112 A1* | 4/2016 | Liang | ................. | G11C 11/5642 714/48 |
| 2016/0118135 A1* | 4/2016 | Dutta | ................. | G11C 16/3459 365/185.03 |

* cited by examiner

| WL# | Lower Page | Upper Page |
|---|---|---|
| 0 | Page 0 | Page 2 |
| 1 | Page 1 | Page 4 |
| 2 | Page 3 | Page 6 |
| 3 | Page 5 | Page 8 |
| ⋮ | ⋮ | ⋮ |
| 126 | Page 251 | Page 254 |
| 127 | Page 253 | Page 255 |

SEMICONDUCTOR MEMORY DEVICE, CONTROL METHOD, AND MEMORY SYSTEM

CROSS-REFERENCE TO RELATED APPLICATIONS

This application is based upon and claims the benefit of priority from U.S. Provisional Application No. 62/257,254, filed on Nov. 19, 2015; the entire contents of which are incorporated herein by reference.

FIELD

Embodiments described herein relate generally to a semiconductor memory device, a control method, and a memory system.

BACKGROUND

A semiconductor memory device having a memory cell and capable of storing data to the memory cell is widely known. The semiconductor memory device injects as much as electrical charge as an amount corresponding to the data into the memory cell. The threshold voltage of the memory cell changes in accordance with the amount of the electrical charge held in the memory cell. The semiconductor memory device determines the data stored in the memory cell by identifying, from among a plurality of ranges of voltages, a range including the threshold voltage of the memory cell.

In recent years, the number of bits of data stored in a single memory cell tends to be increased. In accordance with the increase in the number of bits of data stored in a single memory cell, the algorithm for determining the data becomes complicated, and this worsens the performance of reading.

DETAILED DESCRIPTION

In general, according to one embodiment, a semiconductor memory device includes a memory cell array, a first circuit, and a second circuit. The memory cell array includes a word line having a first memory cell. The first circuit executes program and read. The program is processing for changing a threshold voltage of the first memory cell to a voltage according to data. The data includes first data of a bit and second data of a bit. The program of the second data is executed after the program of the first data. The read is processing for determining the first data or the second data by measuring the threshold voltage. The second circuit manipulates a flag in accordance with execution of the program of the second data. In a case where the second data is a target of the read, the second circuit refers to the flag. In a case where the flag indicates non-execution of the program of the second data, the second circuit aborts the measuring before the measuring of the threshold voltage is completed.

Exemplary embodiments of a semiconductor memory device, a control method, and a memory system will be explained below in detail with reference to the accompanying drawings. The present invention is not limited to the following embodiments.

First Embodiment

Figure 1:
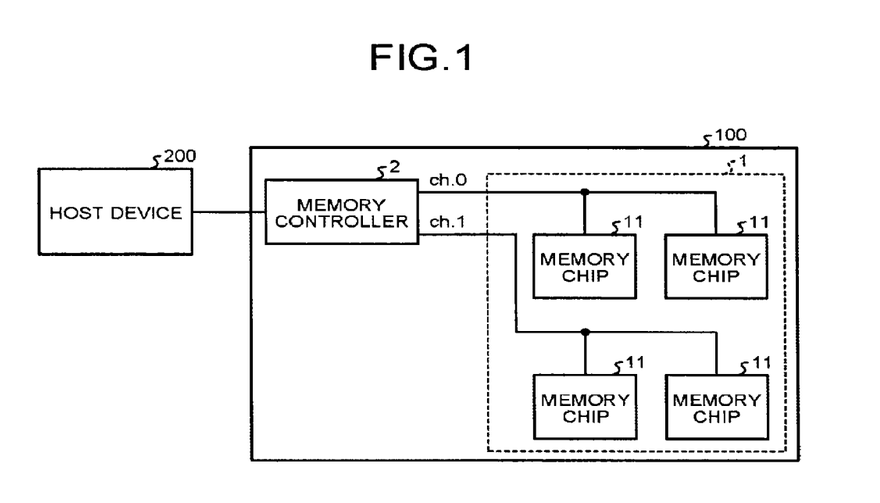
FIG. 1 is a figure illustrating an example of a configuration of a memory system according to a first embodiment.

FIG. 1 is a figure illustrating an example of a configuration of a memory system according to a first embodiment. The memory system 100 is connected to a host device 200 via a communication interface. Any standard may be employed as the standard for the communication interface. The host device 200 corresponds to, for example, a server, a personal computer, or a mobile type information processing device, and the like. The memory system 100 functions as an external memory device of the host device 200.

The memory system 100 includes a NAND type flash memory (NAND memory) 1 and a memory controller 2 executing data transfer between the host device 200 and the NAND memory 1. The NAND memory 1 functions as a storage storing data given by the host device 200.

The NAND memory 1 is constituted by multiple memory chips 11 (four memory chips 11 in this case). Each memory chip 11 corresponds to a semiconductor memory device. The memory controller 2 includes two channels (ch.0, ch.1). Each channel is connected to two memory chips 11. Each channel includes a control signal line, an I/O signal line, a CE (chip enable) signal line, and an RY/BY signal line. The I/O signal line is a signal line for transmitting data, addresses, and command types. The command type includes a read, a program, and an erase. The control signal line collectively refers to a WE (write enable) signal line, an RE (read enable) signal line, a CLE (command latch enable) signal line, an ALE (address latch enable) signal line, and a WP (write protect) signal line, and the like. The signal line groups of the two channels are independent from each other, and therefore, the memory controller 2 can control the two channels in parallel.

It should be noted that the number of memory chips 11 provided in the memory system 100, the number of channels provided in the memory system 100, and the number of memory chips 11 connected to a single channel are not limited to the numbers explained above.

Figure 2:
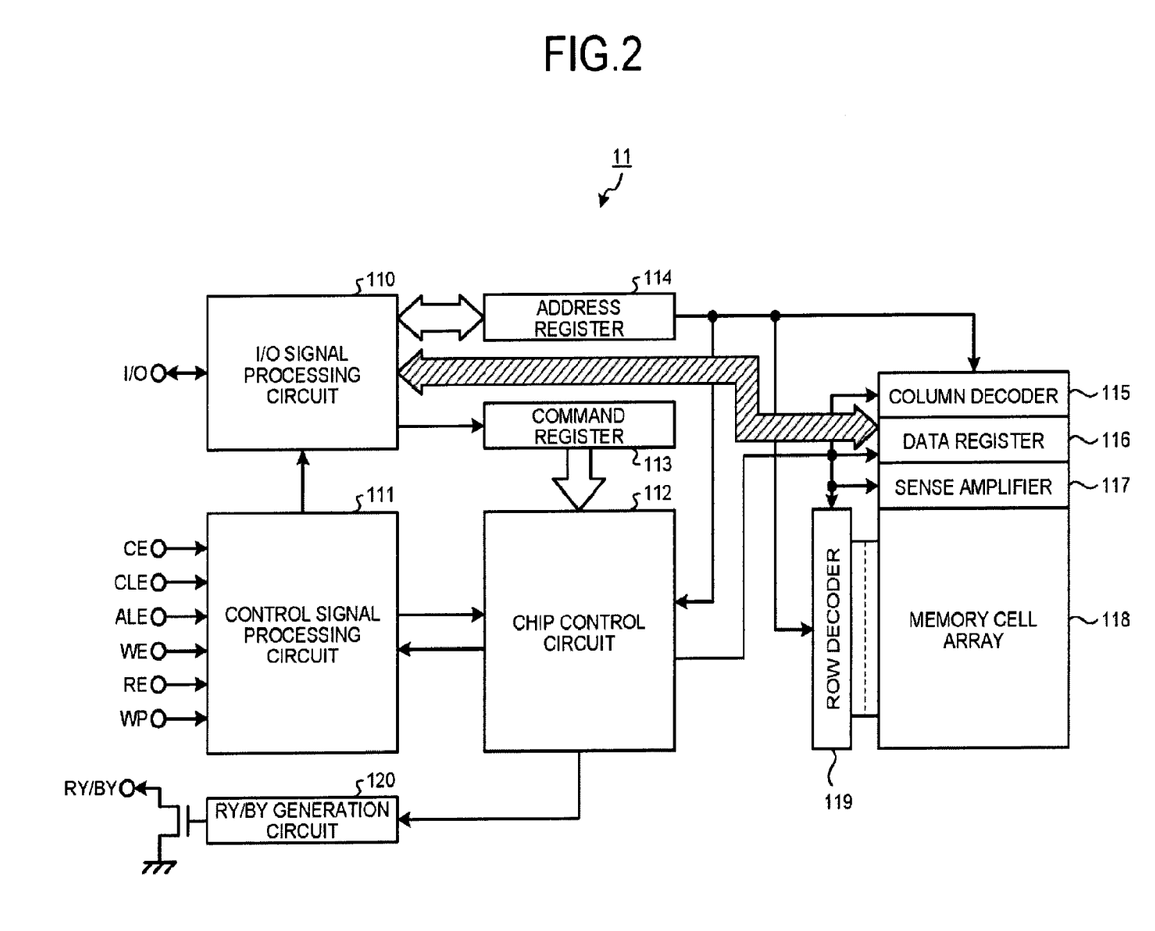
FIG. 2 is a figure for explaining an example of a configuration of each memory chip 11.

FIG. 2 is a figure for explaining an example of a configuration of each memory chip 11. The memory chip 11 includes an I/O signal processing circuit 110, a control signal processing circuit 111, a chip control circuit 112, a command register 113, an address register 114, a column decoder 115, a data register 116, a sense amplifier 117, a memory cell array 118, a row decoder 119, and an RY/BY generation circuit 120.

The chip control circuit 112 is a state transition circuit for changing the state on the basis of various kinds of control signal received via the control signal processing circuit 111. The chip control circuit 112 controls the operation of the entire memory chip 11. The RY/BY generation circuit 120 changes the state of the RY/BY signal line to the ready state (RY) and the busy state (BY) under the control of the chip control circuit 112.

The I/O signal processing circuit 110 is a buffer circuit for transmitting and receiving an I/O signal to/from the memory controller 2. The I/O signal processing circuit 110 can write a command type, an address, and data. The I/O signal processing circuit 110 stores the command type that has been written to the command register 113, stores the address that has been written to the address register 114, stores the data that has been written to the data register 116.

The address stored in the address register 114 includes at least a block address, a page address, and a column address. The block address is identification information of each block provided in the memory cell array 118. The page address is identification information about each page included in each block. The page address includes a row address. The block address and the page address are read by the chip control circuit 112, the row address is read by the row decoder 119, and the column address is read by the column decoder 115.

The control signal processing circuit 111 receives an input of the control signal. The control signal processing circuit 111 switches the register of the storage destination of the I/O signal received by the I/O signal processing circuit 110 on the basis of the received control signal. The control signal processing circuit 111 transfers the received control signal to the chip control circuit 112.

The memory cell array 118 includes multiple blocks. The block is a minimum unit of erasing of data.

Figure 3:
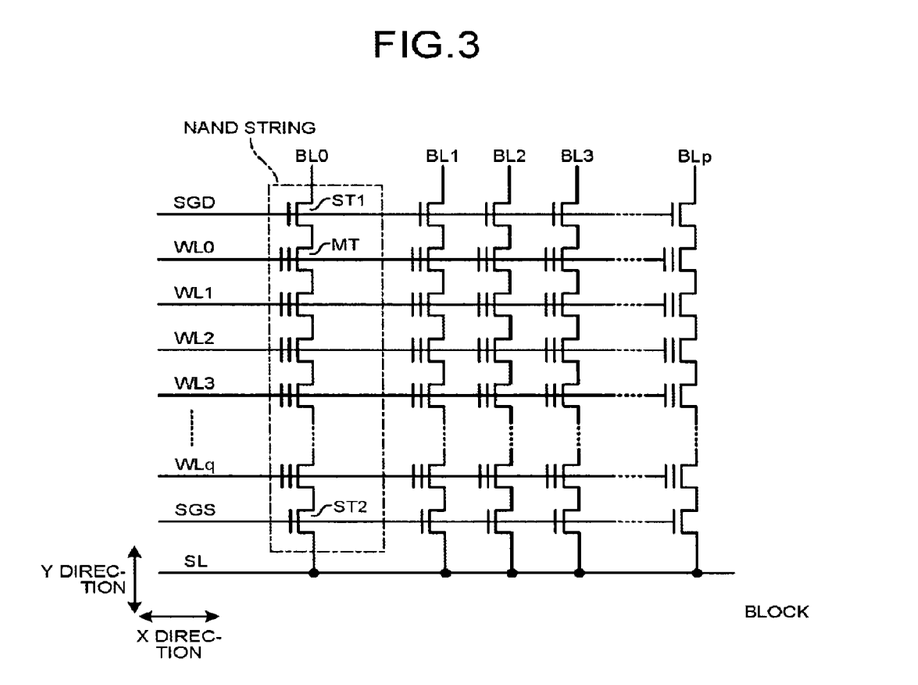
FIG. 3 is a circuit diagram illustrating an example of a configuration of a single block included in a memory cell array 118.

FIG. 3 is a circuit diagram illustrating an example of a configuration of a single block included in the memory cell array 118. As shown in the drawing, each block has (p+1) NAND strings arranged in the X direction in order. The drains of selection transistors ST1 included in the (p+1) NAND strings are connected to bit lines BL0 to BLp, respectively, and the gates of the selection transistors ST1 are commonly connected to a selection gate line SGD. The sources of selection transistors ST2 are commonly connected to a source line SL, and the gates of selection transistors ST2 are commonly connected to a selection gate line SGS.

Each memory cell transistor MT is constituted by an MOSFET (metal oxide semiconductor field effect transistor) having a stacked gate structure formed on a semiconductor substrate. The stacked gate structure includes a floating gate formed above a semiconductor substrate with a tunnel oxide film interposed therebetween and a control gate electrode formed above the floating gate with a gate insulating film interposed therebetween. The threshold voltage changes in accordance with the quantity of electrons accumulated in the floating gate. The memory cell transistor MT stores data in accordance with a difference in the threshold voltage. More specifically, the memory cell transistor MT holds, in the floating gate, as many electrons as the quantity corresponding to the data.

In each NAND string, the (q+1) memory cell transistors MT are arranged in such a manner that an electric current path thereof is connected in series between the source of the selection transistor ST1 and the drain of the selection transistor ST2. The control gate electrodes are connected to the word lines WL0 to WLq in order from the memory cell transistor MT located most closely to the drain side. Accordingly, the drain of the memory cell transistor MT connected to the word line WL0 is connected to the source of the selection transistor ST1, and the source of the memory cell transistor MT connected to the word line WLq is connected to the drain of the selection transistor ST2.

Between the NAND strings in the block, the word lines WL0 to WLq commonly connect the control gate electrodes of the memory cell transistors MT. More specifically, the control gate electrodes of the memory cell transistors MT in the same row in the block are connected to the same word line WL. In a case where each memory cell transistor MT is configured to be able to hold a value of a single bit, the (p+1) memory cell transistors MT connected to the same word line WL are treated as a single page, and for each page, data are programmed, and data are read.

In some cases, each memory cell transistor MT may store a value of multiple bits. For example, in a case where each memory cell transistor MT is capable of storing a value of n (n≥2) bits, the memory capacity per word line is equivalent to a size of n pages. In this case, for example, a memory method in which each memory cell transistor MT stores a value of two bits will be explained. According to this method, each word line holds data of two pages. Of two pages constituted by a single word line, a page that is programmed first will be denoted as a lower page, and a page programmed after the lower page will be denoted as an upper page. A memory cell transistor MT will be simply referred to as a memory cell.

Figure 4:
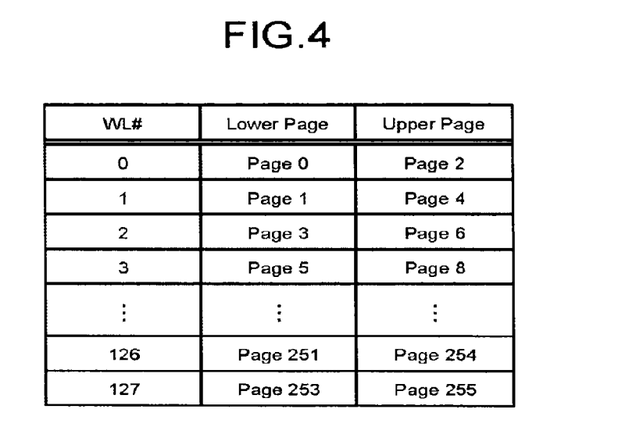
FIG. 4 is a figure illustrating an example of allocation of page addresses.

Page addresses are individually allocated to an upper page and a lower page. FIG. 4 is a figure illustrating an example of allocation of page addresses. According to the example of this drawing, a page address "2*(i+1)−3" is allocated to the lower page of a word line WLi, and a page address "2*(i+1)" is allocated to the upper page of the word line WLi. However, i is a real number which is equal to or more than one and equal to or less than (q−1). A page address is allocated to each page included in each word line located at a border of a block in accordance with a method different from the above. More specifically, a page address "0" is allocated to the lower page of the word line WL0, a page address "2" is allocated to the upper page of the word line WL0. A page address "2*(q+1)−3" is allocated to the lower page of the lower page of the word line WLq, and a page address "2*(q+1)−1" is allocated to the upper page of the lower page of the word line WLq. In FIG. 4, q is considered to be 127. More specifically, a page address "253" is allocated to the lower page of the word line WL127, and a page address "255" is allocated to the upper page of the word line WL127. Programming of blocks are executed in an order of page addresses.

Figure 5:
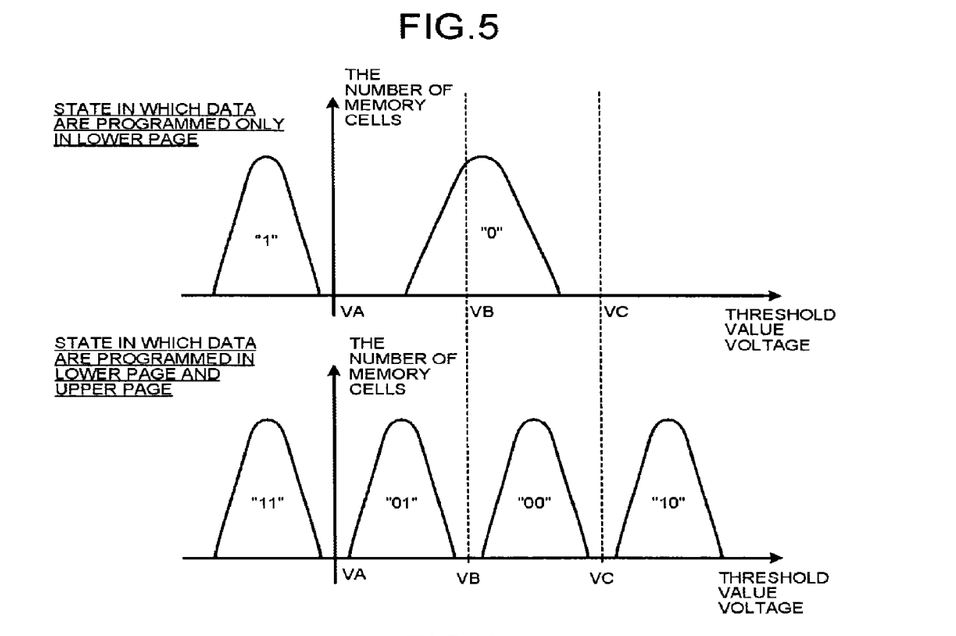
FIG. 5 is a figure illustrating distributions of threshold voltages of memory cell groups which belong to a single word line WL.

FIG. 5 is a figure illustrating a distribution of threshold voltages of memory cell groups which belong to a single word line WL in a state where only the lower page is programmed and a state in which both of the lower page and the upper page are programmed.

In a case where two bits of data can be stored in a single memory cell, the control range of the threshold voltage is divided into four ranges by voltages VA, VB, and VC as shown in FIG. 5.

In the erased state, the threshold voltage is distributed in a range of a negative side with respect to the voltage VA.

In a state in which only the lower page has been programmed, the threshold voltage is distributed in a range at the negative side with respect to the threshold voltage VA and a range at the positive side with respect to the voltage VA. Data "1" is asigned to the range at the negative side with respect to the voltage VA, and data "0" is assigned to the range at the positive side with respect to the voltage VA. In the example as shown in FIG. 5, the threshold voltage corresponding to the data "0" is distributed from the middle of the voltage VA and the voltage VB to the middle of the voltage VB and the voltage VC. The distribution of the threshold voltage corresponding to the data "0" is not limited to the example as shown in FIG. 5. For example, programming may also be executed so that the threshold voltage corresponding to the data "0" is distributed in a range from the voltage VA to the voltage VB. For example, programming may also be executed so that the threshold voltage corresponding to the data "0" is distributed in a range from the voltage VB to the voltage VC.

In the state in which both of the lower page and the upper page are programmed, the threshold voltage is included in any one of the four ranges. The data "11", data "01", data "00", and data "10" are respectively assigned to the four ranges in an order from the range at the most negative side of the four ranges. In a case where a description of data "xy" is used, the data "x" and the data "y" are either data "0" or data "1". The data "x" is data which belong to the upper page, and the data "y" is data which belong to the lower page.

In this case, each word line WL stores a state flag. The state flag indicates whether the word line WL to which the memory cell storing that state flag belongs to is in such a state that both of the lower page and the upper page are programmed or not. In other words, the state flag indicates whether the programming of the upper page of the corresponding word line WL has been executed or not. The state flag can be stored to any memory cell. For example, the state flag is stored to each memory cell connected to a predetermined bit line BL. Alternatively, the state flag may be stored to a memory cell connected to a bit line BL which is different for each word line WL. Still alternatively, the state flag may be stored to a memory area different from the memory cell array 118.

With regard to a memory cell storing a state flag, a relationship between the threshold voltage and the value of the state flag is configured in any manner. In this case, for example, programming of the state flag is executed so that the value of the state flag can be determined by any of the voltage VA and the voltage VB. More specifically, in a case where the threshold voltage is included in the range at the negative side with respect to the voltage VA (i.e., in a case of an erased state), the value of the state flag corresponds to "1". In a case where the threshold voltage is included in the range at the positive side with respect to the voltage VB, the value of the state flag corresponds to "0".

The row decoder 119, the column decoder 115, the data register 116, and the sense amplifier 117 constitute a peripheral circuit. The peripheral circuit executes access (read, program, erase) to the memory cell array 118 on the basis of control performed by the chip control circuit 112.

For example, during programming, the row decoder 119 selects a word line WL corresponding to a read row address, and activates the word line selected. The column decoder 115 selects and activates a bit line BL corresponding to a read column address. The sense amplifier 117 applies a voltage to the bit line BL selected by the column decoder 115, thereby programming data stored in the data register 116 to a memory cell located at a point of intersection of the word line WL selected by the row decoder 119 and the bit line selected by the column decoder 115. "Program data" means that the sense amplifier 117 applies a programming pulse to the floating gate of the memory cell via the word line WL until the threshold voltage attains the range corresponding to the value of the data. After the programming is completed, the threshold voltage of each memory cell forms a mound-shaped distribution for each of the values of data as shown in FIG. 5.

When the lower page is programmed, the chip control circuit 112 keeps the value of the state flag as "1". When the upper page is programmed, the chip control circuit 112 changes the value of the state flag from "1" to "0".

During reading, the sense amplifier 117 pre-charges a power supply potential Vcc to the bit line BL, and the row decoder 119 applies multiple types of voltages (hereinafter referred to as determination voltages) to the selected word line WL in order to determine the data. The sense amplifier 117 determines the value of the data stored in each memory cell on the basis of a comparison between one or more determination voltages and the threshold voltage of each memory cell.

More specifically, for example, the voltages VA, VB, and VC are used as the determination voltages. The row decoder 119 applies a transfer potential to the non-selected word lines WL, so that the memory cells which belong to the non-selected word lines WL are in a conductive state. The sense amplifier 117 determines the data stored in the target memory cell by detecting which determination voltage is applied when the electrical charge accumulated by the pre-charging flows out to the source line SL.

More specifically, for each memory cell, the peripheral circuit measures the threshold voltage with a granularity of two or four areas. Then, the peripheral circuit determines the data programmed in each memory cell on the basis of the threshold voltage based on each memory cell measured.

For example, in a case where the lower page is the read target, the value of the data is determined on the basis of whether the threshold voltage is more than the voltage VA or the voltage VB. In a case where the threshold voltage is more than the voltage VA or the voltage VB, the value of the data is "0", and in a case where the threshold voltage is less than the voltage VA or the voltage VB, the value of the data is "1". In a case where programming of the upper page is executed, the voltage VB is used as the determination voltage. In a case where programming of the upper page is not executed, the voltage VA is used as the determination voltage.

For example, in a case where the upper page is the read target, the value of the data is determined on the basis of whether a condition that the threshold voltage is more than the voltage VA and less than the voltage VC is satisfied or not. More specifically, in a case where the upper page is the read target, the peripheral circuit executes processing for applying the voltage VA to the word line WL and compares the voltage VA and the threshold voltage of each memory cell and processing for applying the voltage VC to the word line WL and compares the voltage VC and the threshold voltage of each memory cell. In a case where the above condition is satisfied, the value of the data is "0", and in a case where the above condition is not satisfied, the value of the data is "1".

It should be noted that each determination voltage is set, for example in the memory chip 11 in advance. Each determination voltage may be set with any given timing by the memory controller 2. Each determination voltage may be changed with any given timing by the memory controller 2.

During erasing, an erase voltage is applied to the substrate of the memory cell array 118. Then, the row decoder 119 makes all the word lines WL of the block, which is to be erased, to be conductive with the ground potential. Accordingly, in each memory cell in the selected block, electrons accumulated in the floating gate are discharged. As a result, the state of each memory cell in the selected block changes to the erased state (i.e., a state of storing data "11").

The sense amplifier 117 stores the data obtained in the determination to the data register 116. The data stored in the data register 116 are sent via the data line to the I/O signal processing circuit 110, and are output from the I/O signal processing circuit 110 to the memory controller 2.

In this case, according to the embodiment, during reading of the upper page, the row decoder 119 sweeps the voltage applied to the word line WL from the voltage of the initial state to the highest voltage. "Sweep" means gradually increasing the voltage. The sense amplifier 117 executes processing (first processing) for comparing the voltage VA and the threshold voltage of each memory cell when the voltage applied to the word line WL attains the voltage VA, and thereafter executes processing (second processing) for comparing the voltage VC and the threshold voltage of each memory cell when the voltage applied to the word line WL attains the voltage VC. The sense amplifier 117 obtains the value of the state flag when the voltage VA is applied to the word line WL. The chip control circuit 112 determines, on the basis of the obtained state flag, as to whether to continue sweeping of the voltage with the row decoder 119 until the second processing is completed, or to abort the sweeping of the voltage with the row decoder 119 before the second processing is completed.

More specifically, in a case where the value of the state flag is "0" indicating that the programming of the upper page has been completed, the chip control circuit 112 causes the peripheral circuit to continue sweeping of the voltage of the word line WL until the voltage of the word line WL attains the voltage VC. In a case where the value of the state flag is "1" indicating that the programming of the upper page has not yet been completed, the chip control circuit 112 causes the peripheral circuit to abort sweeping of the voltage of the word line WL before the voltage of the word line WL attains the voltage VC, and resets the data register 116 with a value indicating the erased state (all "1" in this case). More specifically, in a case where the programming of the upper page has not yet been completed, the chip control circuit 112 aborts measurements of the threshold voltage of each memory cell.

Subsequently, an operation of the memory chip 11 according to the first embodiment will be explained.

Figure 6:
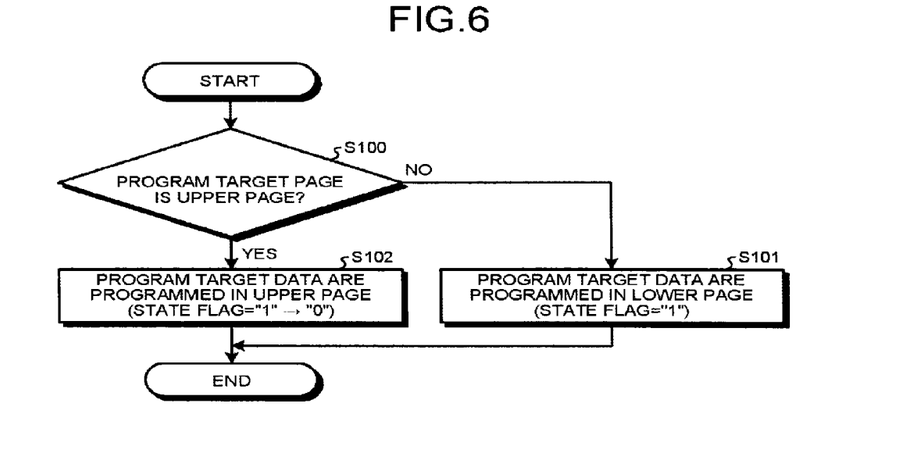
FIG. 6 is a flow chart for explaining an operation during programming.

FIG. 6 is a flow chart for explaining an operation during programming. The memory chip 11 starts programming in accordance with reception of a program command from the memory controller 2. The program command includes a command type indicating the program, data which are to be programmed, and an address.

When the chip control circuit 112 receives the program command, the chip control circuit 112 determines whether the program target page is the upper page or not (S100). The chip control circuit 112 determines whether the program target page is the upper page or not, on the basis of the page address included in the address provided from the memory controller 2.

In a case where the program target page is not the upper page (S100, No), and more specifically, in a case where the program target page is the lower page, the chip control circuit 112 controls the peripheral circuit to program the program target data to the lower page to which the data are to be programmed (S101). At this occasion, the chip control circuit 112 keeps the value of the state flag as "1".

In a case where the program target page is the upper page (S100, Yes), the chip control circuit 112 controls the peripheral circuit to program the program target data to the upper page to which the data are to be programmed (S102). At this occasion, the chip control circuit 112 changes the value of the state flag from "1" to "0".

After the processing of S101 or S102, the memory chip 11 terminates the operation of the program.

As shown in FIG. 6, the chip control circuit 112 changes the value of the state flag from "1" to "0" in accordance with programming of the data to the upper page. The chip control circuit 112 changes the value of the state flag from "0" to "1" by erasing in units of blocks (not shown). As described above, the chip control circuit 112 manipulates the state flag in accordance with execution of programming to the upper page.

Figure 7:
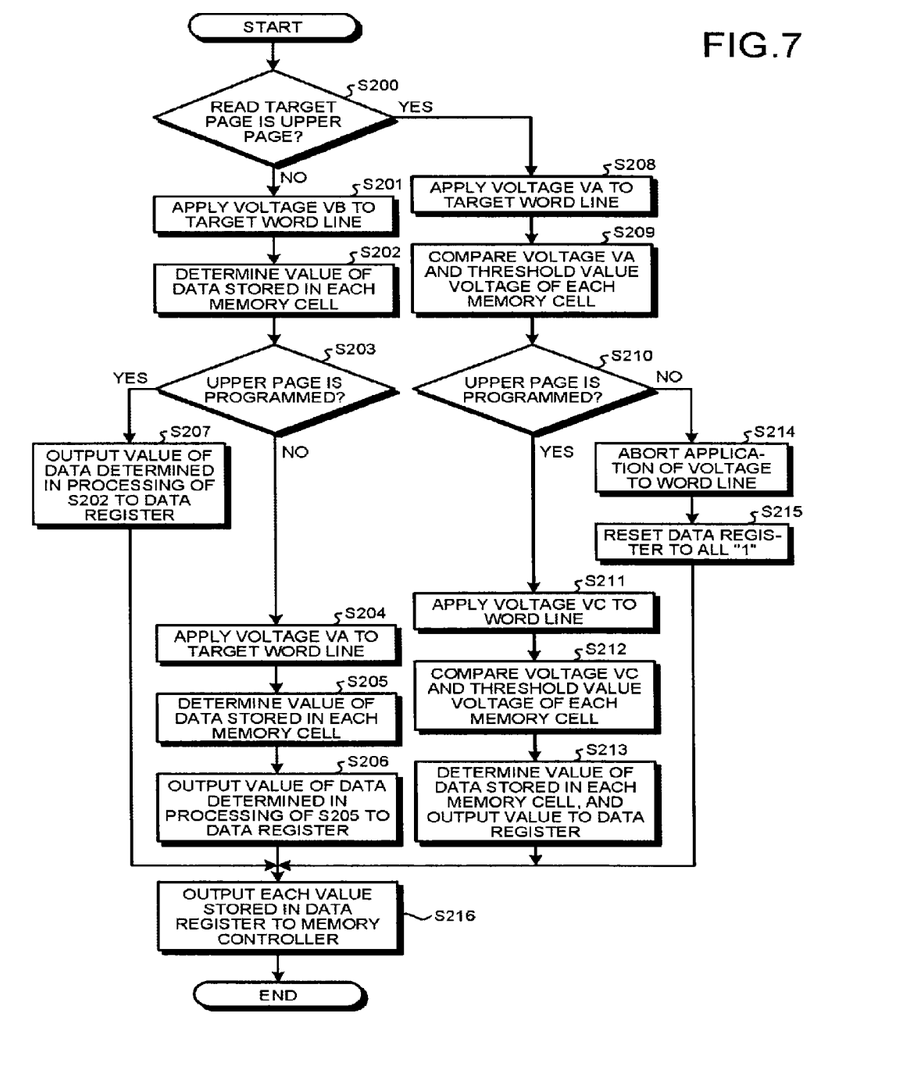
FIG. 7 is a flow chart for explaining an operation during reading.

FIG. 7 is a flow chart for explaining an operation during reading. The memory chip 11 starts programming in accordance with reception of the read command from the memory controller 2. The read command includes the command type indicating the reading and the address.

When the chip control circuit 112 receives the read command, the chip control circuit 112 determines whether the read target page is the upper page or not (S200). The chip control circuit 112 determines whether the read target page is the upper page or not, on the basis of the page address included in the address provided from the memory controller 2.

When the read target page is not the upper page (S200, No), and more specifically, the read target page is the lower page, the chip control circuit 112 causes the row decoder 119 to apply the voltage VB to the target word line WL (S201), and causes the sense amplifier 117 to determine the value of the data stored in each memory cell on the basis of a comparison between the voltage VB and the threshold voltage of each memory cell (S202). In the explanation in FIG. 7, the target word line means a word line to which the read target page belongs. In the explanation in FIG. 7, each memory cell means each memory cell which belongs to the target word line. In the processing of S202, the value of the state flag is read by the sense amplifier 117, and is sent to the chip control circuit 112. In a case where, with regard to the memory cell storing the state flag, the threshold voltage is less than the voltage VB, the sense amplifier 117 determines that the value of the state flag is "1". In a case where, with regard to the memory cell storing the state flag, the threshold voltage is more than the voltage VB, the sense amplifier 117 determines that the value of the state flag is "0".

Subsequent to the processing of S202, the chip control circuit 112 determines whether the program of the upper page of the target word line WL is executed or not, on the basis of the value of the state flag (S203). In a case where the program of the upper page of the target word line WL is executed (S203, No), the chip control circuit 112 causes the row decoder 119 to apply the voltage VA to the target word line WL (S204), and causes the sense amplifier 117 to determine the value of the data stored in each memory cell on the basis of a comparison of the voltage VA and the threshold voltage of each memory cell (S205). The chip control circuit 112 causes the sense amplifier 117 to output, to the data register 116, the value of the data which is determined in the processing of S205 and which is stored in each memory cell (S206).

In a case where the program of the upper page of the target word line WL is not executed (S203, Yes), the chip control circuit 112 causes the sense amplifier 117 to output, to the data register 116, the value of the data which is determined in the processing of S202 and which is stored in each memory cell (S207).

In a case where the read target page is the upper page (S200, Yes), the chip control circuit 112 causes the row decoder 119 to apply the voltage VA to the target word line WL (S208), and causes the sense amplifier 117 to execute comparison of the voltage VA and the threshold voltage of each memory cell (S209). In the processing of S209, the result of the comparison is written into the sense amplifier 117. The value of the state flag is read by the sense amplifier 117, and is sent to the chip control circuit 112. In a case where, with regard to the memory cell storing the state flag, the threshold voltage is less than the voltage VA, the sense amplifier 117 determines that the value of the state flag is "1". In a case where, with regard to the memory cell storing the state flag, the threshold voltage is more than the voltage VA, the sense amplifier 117 determines that the value of the state flag is "0".

Subsequent to the processing of S209, the chip control circuit 112 determines whether the program of the upper page of the target word line WL is executed or not, on the basis of the value of the state flag (S210). In a case where the program of the upper page of the target word line WL is executed (S210, Yes), the chip control circuit 112 causes the row decoder 119 to apply the voltage VC to the target word line WL (S211), and causes the sense amplifier 117 to execute comparison of the voltage VC and the threshold voltage of each memory cell (S212). In the processing of S212, the result of the comparison is written into the sense amplifier 117. The chip control circuit 112 causes the sense amplifier 117 to determine the value of the data stored in each memory cell on the basis of the result of the comparison in S209 and the result of the comparison in S212, and output the value of the data to the data register 116 (S213).

In a case where the program of the upper page of the target word line WL is not executed (S210, No), the chip control circuit 112 causes the row decoder 119 to abort application of the voltage to the target word line WL (S214), and resets the data register 116 with all "1" (S215).

After the processing of S206, S207, S213, or S215, each value stored in the data register 116 is output via the I/O signal processing circuit 110 to the memory controller 2 (S216), and the memory chip 11 terminates the operation of read.

Figure 8:
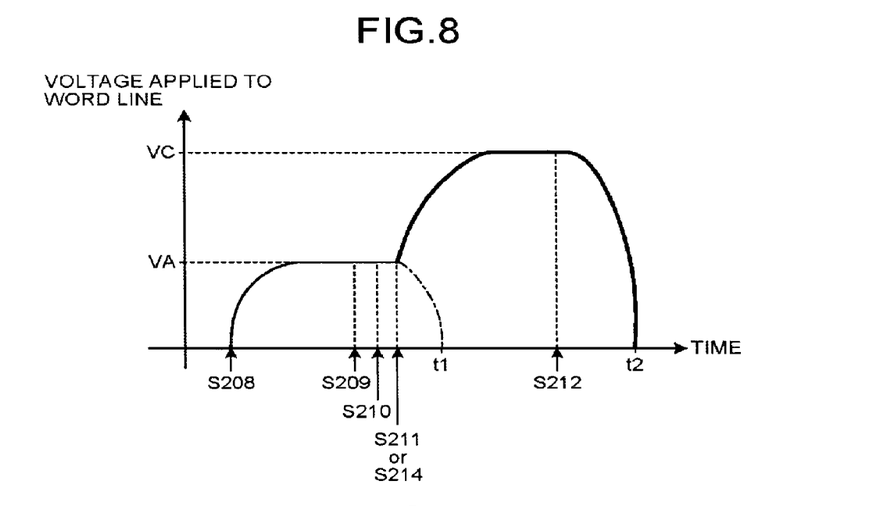
FIG. 8 is a figure illustrating a change of a voltage over time which is applied to a target word line WL in a case where a read target page is an upper page.

FIG. 8 is a figure illustrating a change of a voltage over time which is applied to the target word line WL in a case where a read target page is the upper page. The voltage applied to the target word line WL is raised to the voltage VA in the processing of S208, and then, the processing of S209 is executed. Thereafter, in the processing of S210, a determination is made as to whether the program of the upper page is executed or not. In a case where the program of the upper page is executed, the voltage changes as shown by a thick solid line in this drawing. More specifically, the voltage applied to the target word line WL is raised to the voltage VC (S211), and the processing of S212 is executed, and thereafter, the application of the voltage to the target word line WL is terminated. In a case where the program of the upper page is not executed, the voltage changes as shown by an alternate long and short dashed line in this drawing. More specifically, the application of the voltage to the target word line WL is aborted (S214), and the voltage applied to the target word line WL returns back to the initial state. Accordingly, in a case where the program of the upper page is not executed, a time it takes to return the voltage applied to the target word line WL back to the initial state can be reduced from t2 to t1, and therefore, the speed of the response to the read command given from the memory controller 2 can be improved.

In the above explanation, in a case where the program of the upper page is determined not to be executed in the processing of S210, the chip control circuit 112 aborts the application of the voltage to the word line WL without executing raising of the voltage of the word line WL from the voltage VA to the voltage VC. The chip control circuit 112 may start raising the voltage of the word line WL from the voltage VA to the voltage VC after the processing of S209 and before the processing of S210, and in a case where the program of the upper page is determined not to be executed in the processing of S210, the chip control circuit 112 may abort the application of the voltage to the word line WL.

In the above explanation, in a case where the program of the upper page is determined not to be executed in the processing of S210, the chip control circuit 112 aborts the application of the voltage to the target word line WL (S214), and thereafter, the chip control circuit 112 resets the data register 116 with all "1" (S215). A point in time when the application of the voltage to the target word line WL is aborted and a point in time when the data register 116 is reset to all "1" may in the order opposite to the order in the above explanation. The chip control circuit 112 may cause the row decoder 119 to abort the application of the voltage to the target word line WL, and reset the data register 116 to all "1" after the voltage given to the target word line WL returns back to the initial state.

As the memory chip 11, as long as the threshold voltage of each memory cell connected to the word line WL is controlled in accordance with the voltage according to the data, and the data of multiple pages are configured to be programmed, page by page in order, in a single word line WL, any given type of memory chip can be employed.

As described above, according to the first embodiment, the chip control circuit 112 manipulates the state flag in accordance with execution of the program of the upper page. In a case where the upper page is the read target page, the chip control circuit 112 refers to the state flag. In a case where the state flag indicates that the program of the upper page is not executed, the chip control circuit 112 aborts the measurement of the threshold voltage of each memory cell provided in the target word line WL without waiting for completion of the measurement. In a case where the upper page is the read target and the program of the upper page is not executed, the chip control circuit 112 does not wait for completion of the measurement of the threshold voltage of each memory cell provided in the target word line WL, and therefore, the time it takes to read the data can be reduced.

The "read" includes first processing for applying the voltage VA to the word line WL and comparing the voltage VA and the threshold voltage and second processing for applying the voltage VC to the word line WL and comparing the voltage VC and the threshold voltage. The second processing is executed after the first processing. In a case where the upper page is the read target and the program of the upper page is not executed, the chip control circuit 112 does not wait for completion of the second processing. Therefore, the time it takes to read the data can be reduced.

The state flag is stored to a predetermined memory cell of each word line WL. The state flag is programmed so that the value of the state flag can be determined in the first processing. Therefore, the chip control circuit 112 can obtain the value of the state flag before the second processing is completed.

In a case where the upper page is determined to be the read target and the program of the upper page is determined not to be executed, the chip control circuit 112 resets the data register 116 with a fixed value indicating the erased state. Therefore, in the case where the upper page is the read target and the program of the upper page is not executed, the memory chip 11 can output a value in a short period of time.

Second Embodiment

For example, in a case where the memory chip 11 is configured so that each memory cell can store a value of three bits, each word line holds data for two pages. Of the three pages constituted by a single word line, with respect to the erased state, a page that is programmed in the first time will be denoted as a lower page, a page that is programmed in the second time will be denoted as a middle page, and a page that is programmed in the third time will be denoted as an upper page.

In each word line WL, two memory cells each storing a state flag are reserved. More specifically, one of the two memory cells reserved holds a first state flag indicating whether the program of the middle page is executed or not, and the other of the two memory cells reserved holds a second state flag indicating whether the program of the upper page is executed or not.

In a case where the middle page is the read target, the chip control circuit 112 obtains the value of the first state flag before the voltage applied to the target word line WL attains the maximum determination voltage which is one of multiple determination voltages and which is required to determine the data during the processing of raising the voltage applied to the target word line WL. In a case where the first state flag indicates that the program of the middle page is not executed, the chip control circuit 112 aborts the application of the voltage to the word line WL before the voltage applied to the target word line WL attains the maximum determination voltage which is one of multiple determination voltages and which is required to determine the data, and resets the data register 116 with all "1".

In a case where the upper page is the read target, the chip control circuit 112 obtains the value of the first state flag before the voltage applied to the target word line WL attains the maximum determination voltage which is one of multiple determination voltages and which is required to determine the data during the processing of raising the voltage applied to the target word line WL. In a case where the first state flag indicates that the program of the upper page is not executed, the chip control circuit 112 aborts the application of the voltage to the word line WL before the voltage applied to the target word line WL attains the maximum determination voltage which is one of multiple determination voltages and which is required to determine the data, and resets the data register 116 with all "1".

As described above, in a case where the memory chip 11 is configured so that each memory cell can store a value of (n≥2) bits, each word line stores a state flag indicating whether program of a predetermined page is executed or not. Then, in a case where the predetermined page is the read target, the chip control circuit 112 refers to the state flag in the process of executing comparison between each of multiple determination voltages and the threshold of each memory cell. In a case where the state flag indicates that the program of the predetermined page is not executed, the chip control circuit 112 aborts the comparison between the determination voltage and the threshold voltage before comparison of all the multiple determination voltages is completed.

As described above, even in a case where the memory chip 11 is configured so that each memory cell can store a value of 3 bits or more, the same technique as the first embodiment can be applied.

Third Embodiment

The memory controller 2 executes, on each block, program of data in the order of page address. The memory controller 2 stores information about a last programmed page to a volatile memory in order to execute program of data in the order of page address. When the power is OFF, the memory controller 2 retracts the information in the volatile memory to the NAND memory 1, and when the power is ON, the memory controller 2 loads the information in the NAND memory 1 to the volatile memory. However, the memory controller 2 may fail to retract and restore the information because of unexpected power down. In such case, the memory controller 2 searches a page of a start location of program by performing read from the NAND memory 1 for once or more when the power supply is resumed.

Figure 9:
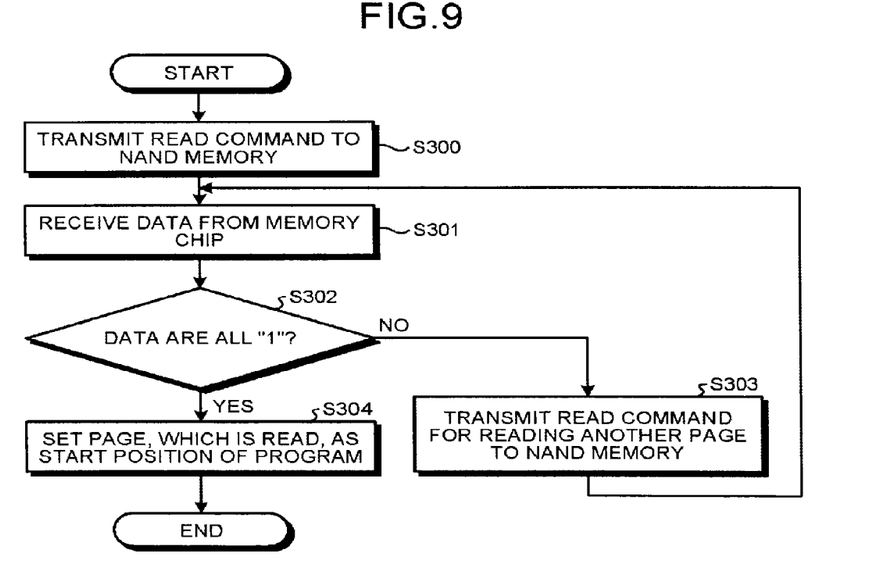
FIG. 9 is a flow chart for explaining an operation for searching a start location of a program.

FIG. 9 is a flow chart for explaining an operation of searching a start location of program. It should be noted that the technique of the first embodiment or the technique of the second embodiment are considered to be applied to each memory chip 11.

First, the memory controller 2 transmits, to the NAND memory 1, a read command including an address designating a location in any given page (S300). Then, the memory controller 2 receives data which are output from the memory chip 11 to which the read command is transmitted (S301), and determines whether the received data are all "1" or not (S302). In a case where the received data are not all "1" (S302, No), the program is already executed at the designated location, and therefore, the memory controller 2 transmits, to the NAND memory 1, a read command including an address for designating a location in another page (S303). In a case where the memory controller 2 receives all "1", any given method may be employed as the method for determining a page designated subsequently. For example, the memory controller 2 designates a location in a page subsequent to the last designated location. For example, the memory controller 2 designates a location of a predetermined page of a word line WL different from the word line WL including the last designated location. After the processing of S303, the memory controller 2 executes the processing of S301.

In a case where the received data are all "1" (S302, Yes), the program is not yet executed at the designated location, and therefore, the memory controller 2 sets the designated location as the start location of the program (S304), and terminates the operation of the search.

As described above, the memory controller 2 issues a read command, and searches the start location of the program on the basis of whether the data which are read in response to the read command are all "1" or not. In a case where the data which are read in response to a read command are not all "1", the memory controller 2 transmits a read command in which a page different from the already read page is set as the read target. For example, in a case where the read target page is the upper page and the program of the read target page is not executed, each memory chip 11 aborts measurement of the threshold voltage and outputs all "1". Therefore, the time it takes to search the start location of the program can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array that includes a word line having a first memory cell;
a first circuit that executes program and read, the program being processing for changing a threshold voltage of the first memory cell to a voltage according to data, the data including first data of a bit and second data of a bit, the program of the second data being executed after the program of the first data, the read being processing for determining the first data or the second data by measuring the threshold voltage; and
a second circuit that manipulates a flag in accordance with execution of the program of the second data, and in a case where the second data is a target of the read, the second circuit refers to the flag, and in a case where the flag indicates non-execution of the program of the second data, the second circuit aborts the measuring before the measuring of the threshold voltage is completed.

2. The semiconductor memory device according to claim 1, wherein the measuring includes first processing and second processing executed after the first processing,
the first processing is processing for applying a first voltage to the word line and comparing the threshold voltage and the first voltage,
the second processing is processing for applying a second voltage different from the first voltage to the word line and comparing the threshold voltage and the second voltage, and
in a case where the flag indicates non-execution of the program of the second data, the second circuit aborts the measuring before the second processing is completed.

3. The semiconductor memory device according to claim 2, wherein the word line further includes a second memory cell storing the flag,
the first processing includes processing for determining the flag on the basis of a comparison between a threshold voltage of the second memory cell and the first voltage, and
the second circuit obtains, from the first circuit, the flag determined in the first processing.

4. The semiconductor memory device according to claim 3, wherein in a case where the flag indicates non-execution of the program of the second data, the second circuit does not cause the first circuit to start the second processing.

5. The semiconductor memory device according to claim 3, wherein the first circuit further includes a data register holding read data, and
in a case where the flag indicates non-execution of the program of the second data, the second circuit resets the data register with a fixed value.

6. The semiconductor memory device according to claim 5, wherein in a case where the flag indicates non-execution of the program of the second data, the second circuit does not cause the first circuit to start the second processing.

7. The semiconductor memory device according to claim 2, wherein, during the measuring, the second circuit raises a voltage of the word line from a voltage of an initial state, and
in a case where the flag indicates non-execution of the program of the second data, the second circuit causes the first circuit to terminate applying the voltage of the word line before the voltage of the word line attains the second voltage.

8. The semiconductor memory device according to claim 7, wherein the first circuit further includes a data register holding read data, and
in a case where the flag indicates non-execution of the program of the second data, the second circuit resets the data register with a fixed value, and thereafter, causes the first circuit to terminate the applying the voltage of the word line.

9. The semiconductor memory device according to claim 7, wherein the first circuit further includes a data register holding read data, and
in a case where the flag indicates non-execution of the program of the second data, the second circuit causes the first circuit to terminate the applying the voltage to the word line, and after the voltage of the word line returns back to the initial state, the second circuit resets the data register with a fixed value.

10. A control method for controlling a memory cell array having a word line, comprising:
programming data in a first memory cell provided in the word line, the programming including changing a threshold voltage of the first memory cell to a voltage according to data; and
reading the data from the first memory cell, the reading including measuring the threshold voltage and determining the data on the basis of the measured threshold voltage, the data including first data of a bit and second data of a bit, the program of the second data being executed after the program of the first data,
wherein in a case where the first data are a target of read, the reading is performed such that a determination as to whether the second data are programmed in the first memory cell or not on the basis of a flag is performed, and in a case where the second data is not programmed in the first memory cell, the measuring of the threshold voltage is aborted.

11. The control method according to claim 10, wherein the measuring includes first processing and second processing executed after the first processing,
the first processing is processing for applying a first voltage to the word line and comparing the threshold voltage and the first voltage,
the second processing is processing for applying a second voltage different from the first voltage to the word line and comparing the threshold voltage and the second voltage, and
the aborting is aborting the measuring before the second processing is completed.

12. The control method according to claim 11 further comprising storing the flag to a second memory cell provided in the word line,
wherein the first processing includes processing for determining the flag on the basis of a comparison between a threshold voltage of the second memory cell and the first voltage, and the determining the data includes determining the data on the basis of a value of the flag determined in the first processing.

13. The control method according to claim 12, wherein the aborting includes not starting the second processing.

14. The control method according to claim 12 further comprising resetting a data register, provided for output of the first data, with a fixed value, in a case where the first data is not programmed in the first memory cell.

15. The control method according to claim 14, wherein the aborting includes not starting the second processing.

16. The control method according to claim 11, wherein the measuring further includes raising a voltage of the word line from a voltage of an initial state, and
the aborting includes terminating applying the voltage of the word line before the voltage of the word line attains the second voltage.

17. The control method according to claim 11, wherein the measuring further includes raising a voltage of the word line from a voltage of an initial state, and
the aborting includes resetting the data register with a fixed value, and terminating applying the voltage of the word line after the resetting.

18. The control method according to claim 11, wherein the measuring further includes raising a voltage of the word line from a voltage of an initial state, and
the aborting includes returning the voltage of the word line back to the voltage of the initial state, and resetting a data register, provided for output of the first data, with a fixed value, after the voltage of the word line is returned back to the voltage of the initial state.

19. A memory system comprising:
a memory controller; and
a semiconductor memory device including a memory cell array including a memory cell, a first circuit that executes program and read, and a second circuit that controls the first circuit, the program being processing for changing a threshold voltage of the memory cell to a voltage according to data, the data including first data of one bit and second data of one bit, the program of the second data being executed after the program of the first data, the read being processing for determining the first data or the second data by measuring the threshold voltage,
wherein the memory controller transmits a read command including a read target to the semiconductor memory device,
the second circuit manipulates a flag in accordance with execution of the program of the second data, and in a case where the read target indicates a location of the second data, the second circuit refers to the flag, and in a case where the flag indicates non-execution of the program of the second data, the second circuit aborts the measuring before the measuring of the threshold voltage is completed and outputs a fixed value.

20. The memory system according to claim 19, wherein the memory cell array includes a plurality of memory areas,
the memory controller transmits, to the semiconductor memory device, a first read command designating one of the plurality of memory areas as a read target when a power is turned ON,
in a case where the fixed value is received in response to the first read command, the one of the memory areas is set as a start location of a program, and
in a case where the second data are received in response to the first read command, a second read command designating the other of the plurality of memory areas as the read target is transmitted to the semiconductor memory device.

* * * * *